United States Patent
Tomita et al.

(10) Patent No.: US 11,586,117 B2
(45) Date of Patent: Feb. 21, 2023

(54) LAMP, LIGHT SOURCE DEVICE, EXPOSURE APPARATUS, AND ARTICLE MANUFACTURING METHOD

(71) Applicant: CANON KABUSHIKI KAISHA, Tokyo (JP)

(72) Inventors: Hiroyuki Tomita, Tochigi (JP); Mizuma Murakami, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/704,213

(22) Filed: Mar. 25, 2022

(65) Prior Publication Data

US 2022/0326621 A1 Oct. 13, 2022

(30) Foreign Application Priority Data

Apr. 12, 2021 (JP) .............................. JP2021-067246

(51) Int. Cl.
*G03F 7/20* (2006.01)
(52) U.S. Cl.
CPC ...... *G03F 7/70891* (2013.01); *G03F 7/70016* (2013.01); *G03F 7/70175* (2013.01)
(58) Field of Classification Search
CPC ............. G03F 7/70175; G03F 7/70141; G03F 7/70016; G03F 7/70; G03F 7/70008; G03F 7/7015; G03F 7/70841; G03F 7/70858; G03F 7/70883; G03F 7/70891; G03F 7/70908–70941; G03F 7/7095; G03F 7/70991; H01J 61/523; H01J 61/52; H01J 61/526; H01J 5/50–56; H01J 5/32; H01J 5/46; F21V 19/006

USPC .......... 355/30, 52–55, 67–77; 362/294, 373, 362/218, 264, 345, 249.01, 547, 580, 362/296.05, 309; 313/46, 24, 623, 45, 313/240, 631, 11, 22, 246, 40, 42, 30, 33, 313/35, 36, 49–51, 317–318.12

See application file for complete search history.

(56) References Cited

U.S. PATENT DOCUMENTS

| 2,520,262 A | * | 8/1950 | Slooff | H01J 19/36 |
| | | | | 174/15.3 |
| 8,519,623 B2 | * | 8/2013 | Koger | H01J 61/86 |
| | | | | 313/623 |

(Continued)

FOREIGN PATENT DOCUMENTS

| JP | 09213129 A | * | 8/1997 | |
| JP | 2000075496 A | * | 3/2000 | ............ H01J 61/523 |
| JP | 2003-017003 A | | 1/2003 | |

*Primary Examiner* — Christina A Riddle
(74) *Attorney, Agent, or Firm* — Carter, DeLuca & Farrell LLP

(57) ABSTRACT

A lamp having a fin provided in a periphery of a metal base. The fin includes a first surface close to a bright spot of a light-emitting tube and a second surface far from the bright spot on an opposite side of the first surface. A distance between a first inner edge of the first surface and a bright spot plane as a plane orthogonal to a center axis of the metal base including the bright spot is shorter than a distance between the bright spot plane and a first outer edge of the first surface. A distance between the first inner edge and the first outer edge of the first surface is not shorter than a distance between a second inner edge and a second outer edge of the second surface.

18 Claims, 11 Drawing Sheets

(56) References Cited

U.S. PATENT DOCUMENTS

| | | | |
|---|---|---|---|
| 2008/0218049 A1* | 9/2008 | Shirasu | F21V 19/006 313/46 |
| 2009/0146540 A1* | 6/2009 | Iguchi | H01J 61/52 313/46 |
| 2016/0266497 A1* | 9/2016 | Suda | G02B 19/0028 |

* cited by examiner

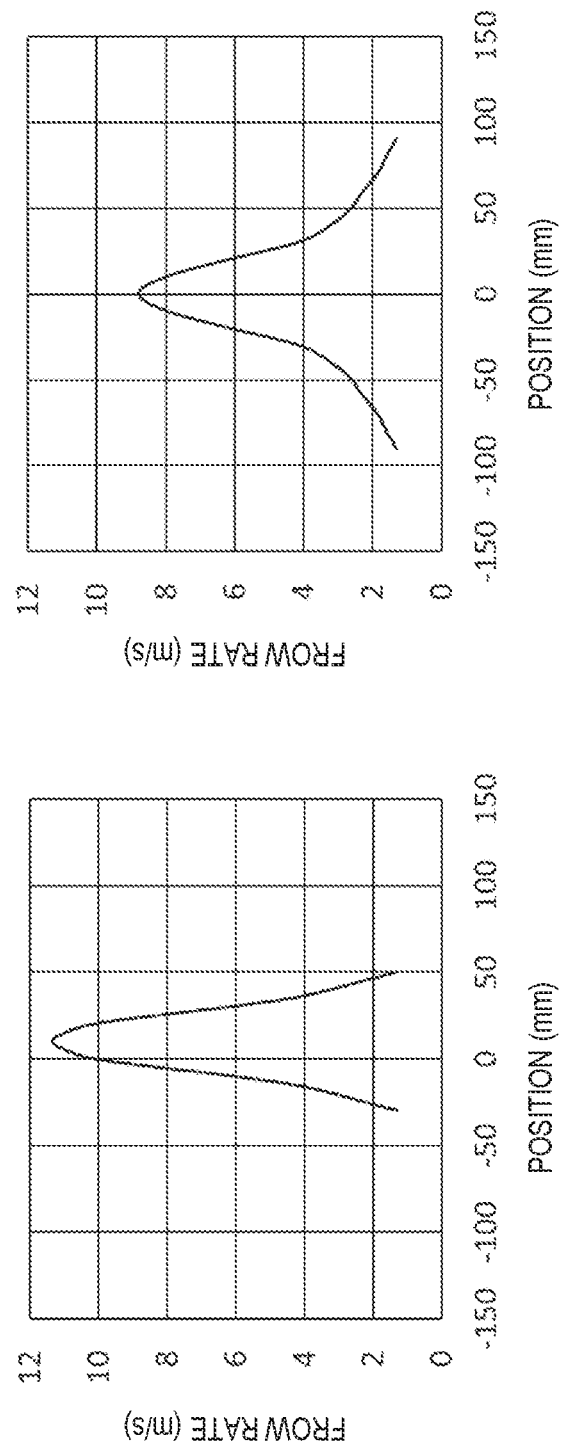

LAMP, LIGHT SOURCE DEVICE, EXPOSURE APPARATUS, AND ARTICLE MANUFACTURING METHOD

BACKGROUND OF THE INVENTION

Field of the Invention

The present invention relates to a lamp, a light source device, an exposure apparatus, and an article manufacturing method.

Description of the Related Art

An exposure apparatus is used in a lithography step for manufacturing a device such as a semiconductor device or a display device. A light source device is incorporated in the exposure apparatus, and the light source device can include an exchangeable lamp. The lamp includes, for example, a pair of metal bases, a light-emitting tube arranged between the pair of metal bases, and a pair of electrodes arranged in the light-emitting tube and connected to the pair of metal bases, respectively. Mercury or the like as a light-emitting substance can be enclosed in the light-emitting tube. When power is supplied between the pair of electrodes via the pair of metal bases, arc discharge occurs between the pair of electrodes, and the lamp can thus emit light. When the lamp is caused to emit light, the temperature of the metal bases is high, and the metal bases need to be cooled. Japanese Patent Laid-Open No. 2003-17003 describes a light source device that includes, in a metal base portion, a fin configured to increase the cooling efficiency and cools the metal base portion by blowing cooling air to the fin.

The temperature of the metal bases tends to rise along with an increase in the output of the lamp. To sufficiently cool the metal bases, it is necessary to blow a sufficient flow amount of gas to the metal bases. However, if the light-emitting tube is excessively cooled by the gas, the light-emitting substance such as mercury in the light-emitting tube cannot sufficiently be evaporated, and a lighting failure of the lamp may occur.

SUMMARY OF THE INVENTION

The present invention provides a technique advantageous in causing a lamp to stably emit light.

The present invention in its one aspect provides a lamp comprising a light-emitting tube having a bright spot, a metal base connected to an end portion of the light-emitting tube, and a fin provided in a periphery of the metal base, wherein the fin includes a first surface close to the bright spot and a second surface far from the bright spot on an opposite side of the first surface, a distance between a first inner edge of the first surface and a bright spot plane as a plane orthogonal to a center axis of the metal base including the bright spot is shorter than a distance between the bright spot plane and a first outer edge of the first surface, and a distance between the first inner edge and the first outer edge of the first surface is not shorter than a distance between a second inner edge and a second outer edge of the second surface.

Further features of the present invention will become apparent from the following description of exemplary embodiments (with reference to the attached drawings).

BRIEF DESCRIPTION OF THE DRAWINGS

FIGS. 11A and 11B are graphs for explaining a difference in the flow rate distribution of air caused by a difference in the fin shape;

DESCRIPTION OF THE EMBODIMENTS

Figure 1:
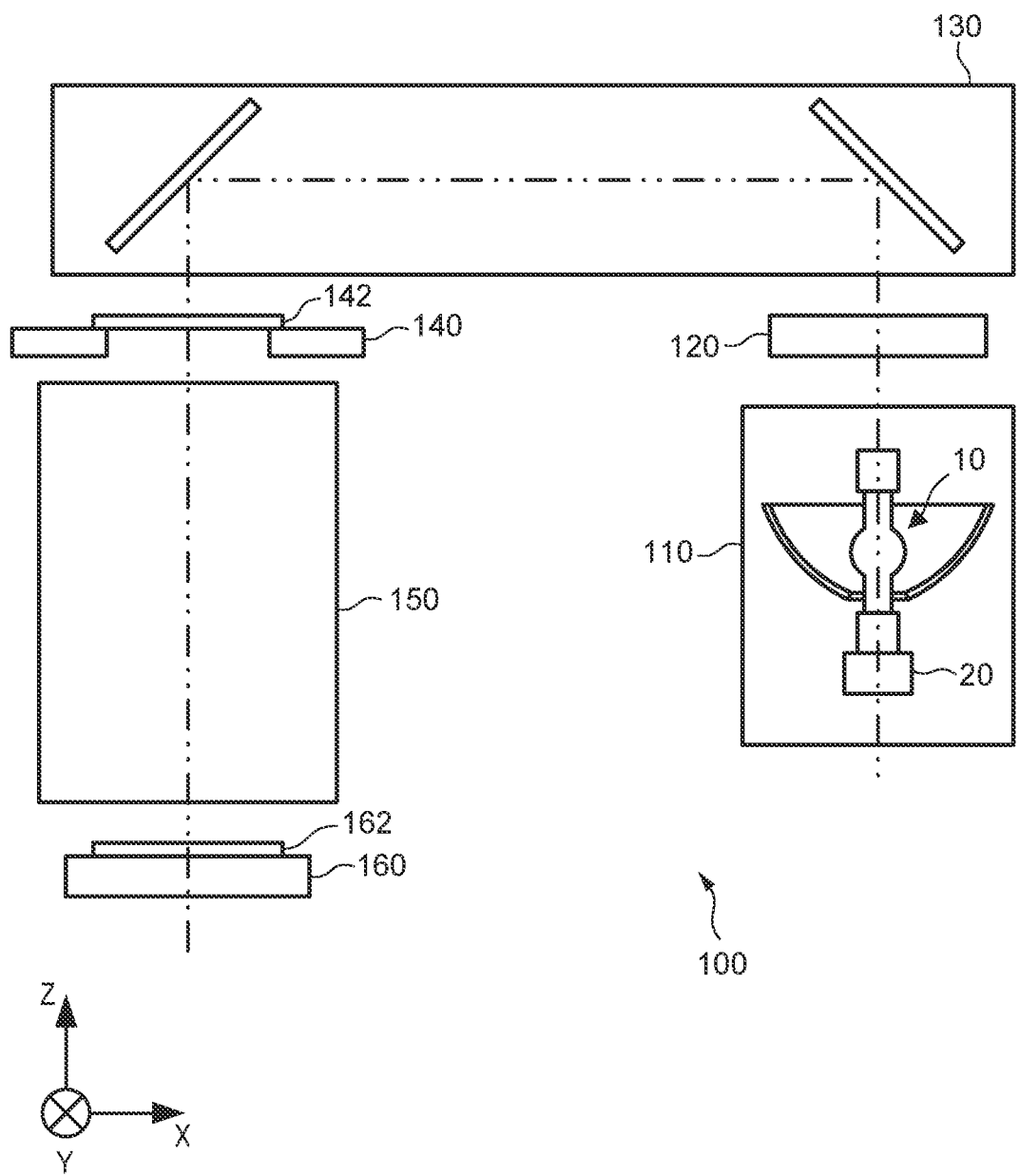
FIG. 1 is a view schematically showing the configuration of an exposure apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In this specification and the accompanying drawings, directions are indicated on an XYZ coordinate system having a horizontal plane as the X-Y plane. In general, a substrate to be exposed is placed on a substrate stage so that the surface of the substrate is parallel to the horizontal plane (X-Y plane). In the following description, directions orthogonal to each other within the plane along the surface of the substrate are set as the X-axis and the Y-axis, respectively, and a direction perpendicular to the X-axis and the Y-axis is set as the Z-axis. Furthermore, directions parallel to the X-axis, the Y-axis, and the Z-axis on the XYZ coordinate system will be referred to as the X direction, the Y direction, and the Z direction, respectively, hereinafter.

First Embodiment

FIG. 1 shows the configuration of an exposure apparatus 100 according to the first embodiment of the present invention. The exposure apparatus 100 is an apparatus that forms a latent image pattern corresponding to the pattern of an original on a photosensitive agent by projecting, via a projection optical system, the pattern of the original to a substrate coated with the photosensitive agent. The exposure apparatus 100 can include, for example, a light source device 110, a shutter device 120, an illumination optical system 130, an original holder 140, a projection optical system 150, and a substrate holder 160. The light source device 110 can include a holder 20 that holds a lamp 10. The original holder 140 holds an original 142. The original holder 140 is positioned by an original positioning mechanism (not shown), and the original 142 can thus be positioned. The substrate holder 160 holds a substrate 162. The substrate 162 which is coated with a resist (photosensitive material) by a resist coating device is supplied to the exposure apparatus 100. The substrate holder 160 is positioned by a substrate positioning mechanism (not shown) and the substrate 162 can thus be positioned.

The shutter device 120 is arranged so as to be capable of shielding a luminous flux in an optical path between the light source device 110 and the original holder 140. The illumination optical system 130 illuminates the original 142 using light from the light source device 110. The projection optical system 150 projects the pattern of the original 142 illuminated by the illumination optical system 130 to the substrate 162, and the substrate 162 is thus exposed. This forms a latent image pattern on the resist with which the substrate 162 is coated. The latent image pattern is developed by a developing device (not shown), and the resist pattern is formed on the substrate 162.

Figure 2:
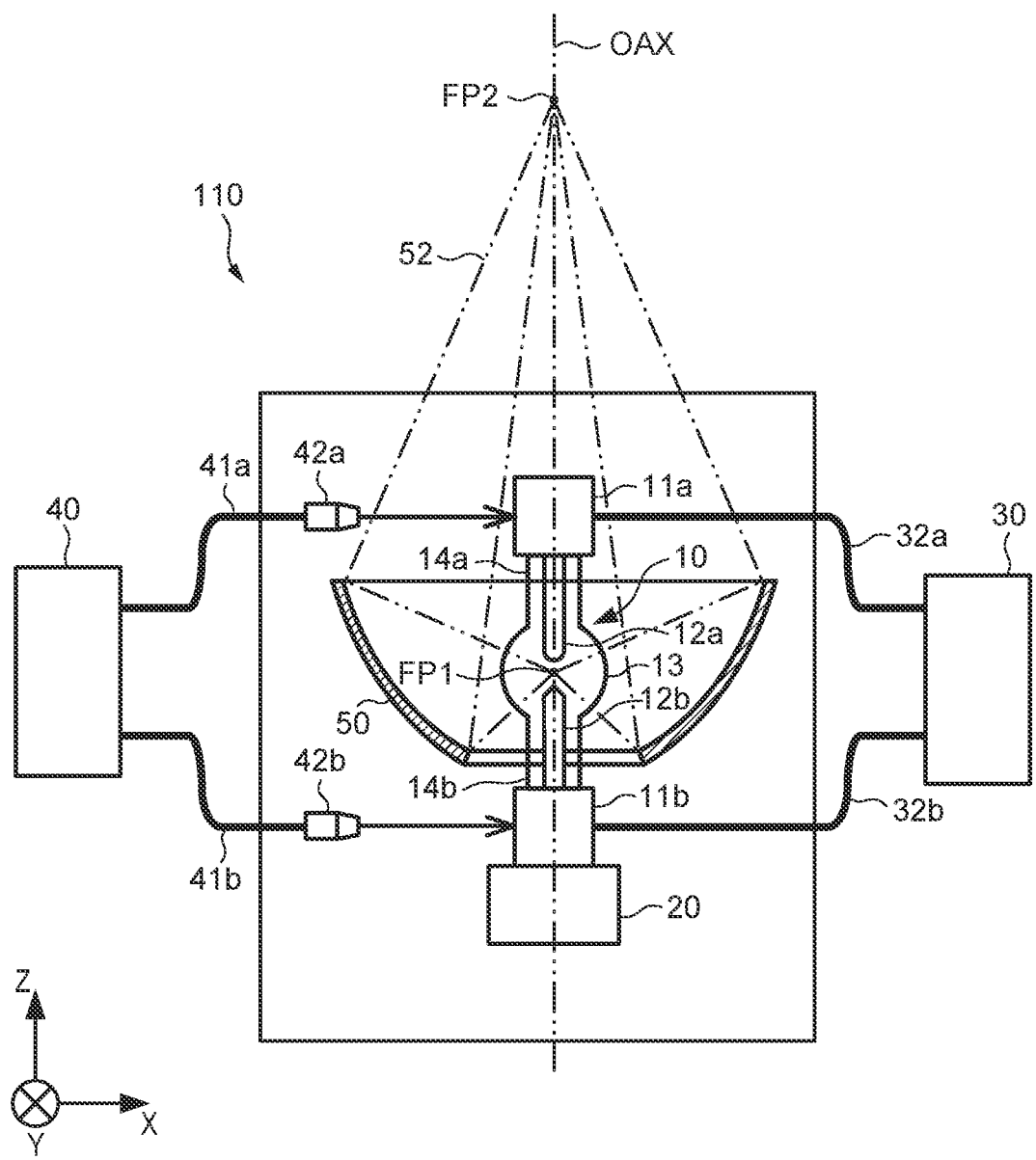
FIG. 2 is a view schematically showing the configuration of a light source device.

FIG. 2 shows the configuration of the light source device 110. The light source device 110 can include the holder 20 that holds the lamp 10, a condensing mirror 50 that condenses light generated by the lamp 10, and nozzles 42a and 42b including ejection holes that eject a gas to cool metal bases 11a and 11b of the lamp 10. Furthermore, the light source device 110 can include a power supply unit (amp power supply) 30 that supplies power to the lamp 10 via lead wires (cables) 32a and 32b, and a gas supply unit 40 that supplies a gas to the nozzles 42a and 42b via supply tubes 41a and 41b, respectively.

The lamp 10 can be, for example, a short arc type lamp such as a mercury lamp, a xenon lamp, or a metal halide lamp. The condensing mirror 50 can be, for example, an ellipsoid mirror having two focal points FP1 and FP2. A bright spot AP of the lamp 10 is arranged at or near the first focal point FP1, and the condensing mirror 50 can reflect light radiated from the bright spot AP and condense it to the second focal point FP2. The diameter of the opening portion of the condensing mirror 50 can depend on the size of the lamp 10 and is, for example, 300 to 400 mm. Furthermore, the lamp 10 can be arranged on an optical axis OAX (an axis that connects the first focal point FP1 and the second focal point FP2) of the condensing mirror 50. The nozzles 42a and 42b can be arranged to blow high-pressure air supplied from the gas supply unit 40 to the metal bases 11a and 11b, respectively. This cools the metal bases 11a and 11b. Not to shield an effective luminous flux 52 reflected by the condensing mirror 50, the nozzle 42a can be arranged outside the effective luminous flux 52. To cool the metal bases 11a and 11b, not air but another cooling medium, for example, a gas such as nitrogen or helium may be used.

The lamp 10 can include a light-emitting tube 13 having the bright spot AP, the pair of metal bases 11a and 11b connected to the two end portions of the light-emitting tube 13, and stems 14a and 14b extending from the metal bases 11a and 11b, respectively. The light-emitting tube 13 can be arranged between the stems 14a, and 14b. The stems 14a and 14b and the light-emitting tube 13 can be integrally formed. The lamp 10 can further include a pair of electrodes 12a and 12b arranged in the stems 14a and 14b and the light-emitting tube 13. In an example, the metal base 11a can be an anode-side metal base, the metal base 11b can be a cathode-side metal base, the electrode 12a, can be an anode, and the electrode 12b can be a cathode.

Figure 3A:
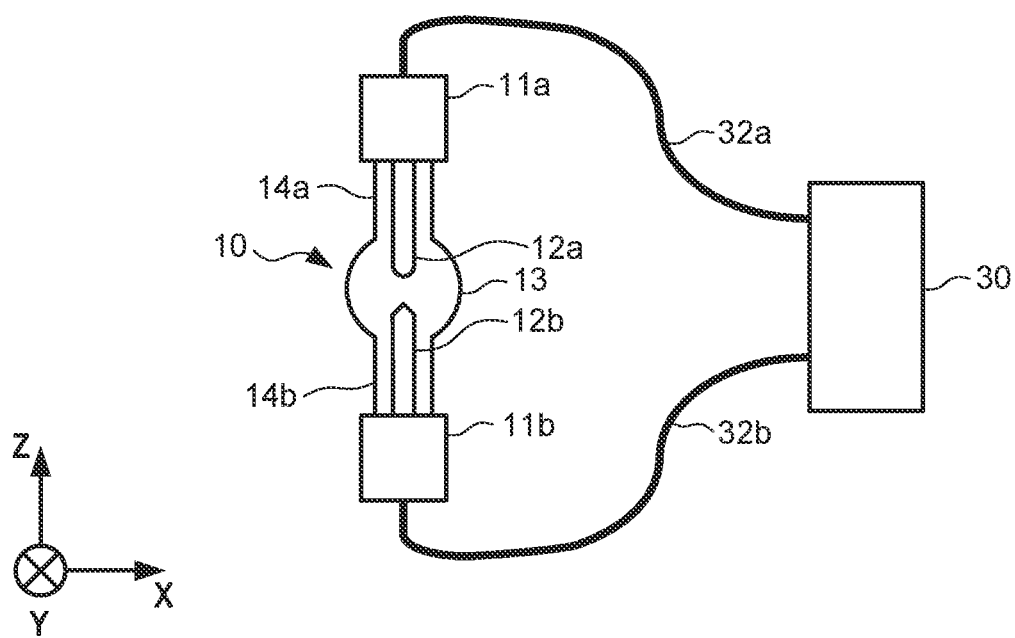
FIGS. 3A and 3B are views each showing an arrangement example of lead wires.
Figure 3B:
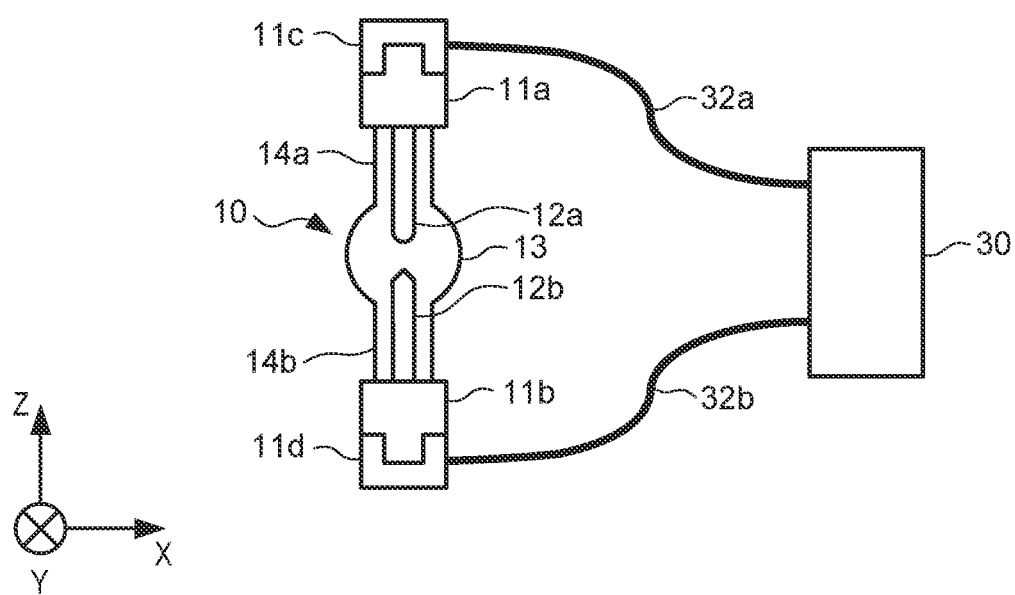

The metal base 11a and the electrode 12a can be connected by a connecting portion such as a molybdenum foil. Similarly, the metal base 11b and the electrode 12b can be connected by a connecting portion such as a molybdenum foil. A rare gas such as neon or xenon, a metal such as mercury, sodium, or scandium, or a substance mixture thereof can be enclosed in the light-emitting tube 13. Light is emitted by arc discharge between the pair of electrodes 12a and 12b. The metal bases 11a and 11b can be connected to the power supply unit 30 by the lead wires 32a and 32b, respectively. FIG. 2 shows an example in which the lead wires 32a and 32b are connected to the side surfaces of the metal bases 11a and 11b, respectively. The lead wires 32a and 32b may be connected to the end faces of the metal bases 11a and 11b, respectively, as shown in FIG. 3A. Alternatively, as exemplified in FIG. 3B, the lead wires 32a and 32b may be connected to the metal bases 11a and 11b via connectors 11c and 11d such as lead wire connecting terminals, adapters, or fixing fittings, respectively. Furthermore, the lead wires 32a and 32b may be formed by conductive wires or may be formed by other conductive members.

Note that when explaining the metal bases 11a and 11b without distinction, these will be expressed as a metal base 11 hereinafter. A description about the metal base 11 is a description about the metal base 11a and/or the metal base 11b. Similarly, when explaining the lead wires 32a and 32b without distinction, these will be expressed as a lead wire 32 hereinafter. A description about the lead wire 32 is a description about the lead wire 32a and/or the lead wire 32b. Similarly, when explaining the nozzles 42a and 42b without distinction, these will be expressed as a nozzle 42 hereinafter. A description about the nozzle 42 is a description about the nozzle 42a and/or the nozzle 42b. Similarly, when explaining the supply tubes 41a and 41b without distinction, these will be expressed as a supply tube 41 hereinafter. A description about the supply tube 41 is a description about the supply tube 41a and/or the supply tube 41b.

Figure 4A:
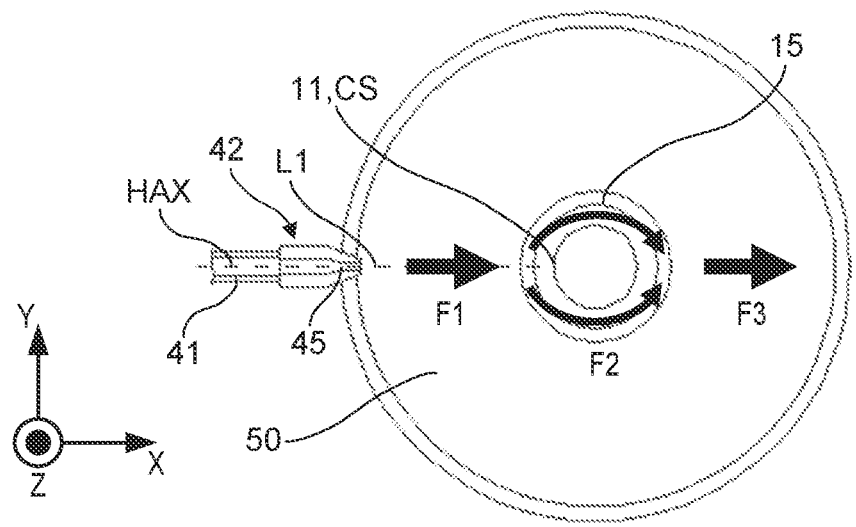
FIGS. 4A and 4B are views schematically showing the configuration of the light source device.
Figure 4B:
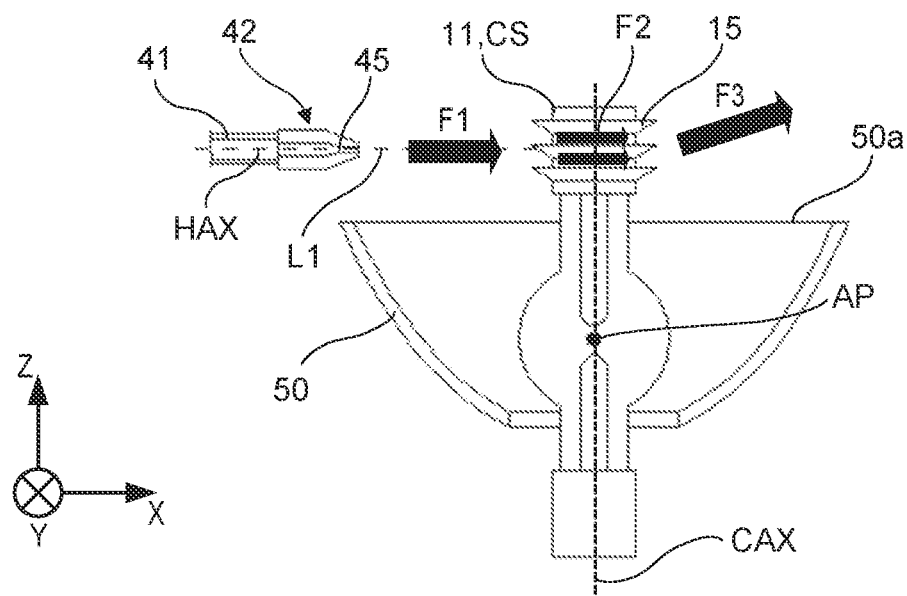

FIGS. 4A and 4B schematically show an arrangement example of the metal base 11, the nozzle 42, and the condensing mirror 50. FIG. 4A shows a plan view when viewed from the Z direction, that is, orthogonal projection to the X-Y plane. FIG. 4B shows a side view when viewed from the Y direction, that is, orthogonal projection to the X-Z plane as a plane parallel to a center axis CAX of the metal base 11. The metal base 11 can include a cylindrical surface CS and at least one cooling fin 15 radially extending outside the cylindrical surface. The nozzle 42 includes an ejection hole 45 that ejects the gas to cool the metal base 11. The ejection hole 45 has a center axis HAX. For example, if the ejection hole 45 has a cylindrical shape, the center axis HAX of the ejection hole 45 matches the center axis of the cylindrical shape. The nozzle 42 is arranged at a position where the center axis HAX intersects the center of the metal base 11 or at least part of the fin 15 or the metal base 11. The flow of the gas ejected from the ejection hole 45 is schematically shown as F1, F2, and F3.

Figure 5:
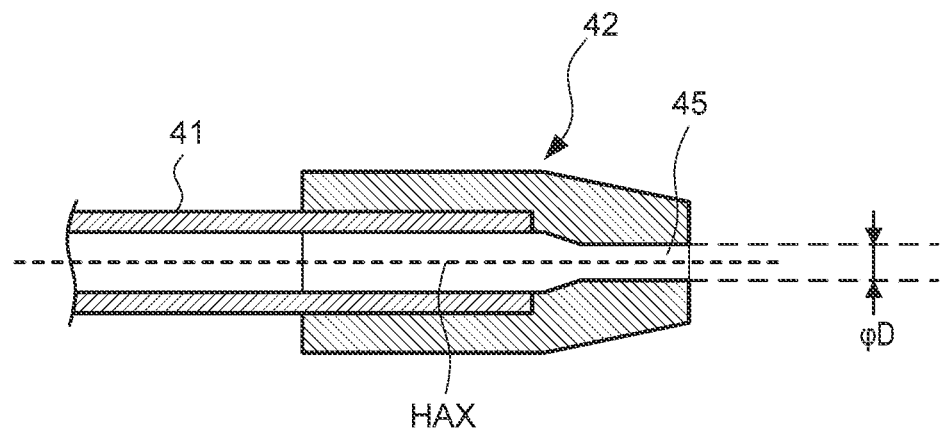
FIG. 5 is a view schematically showing a nozzle in the light source device.

FIG. 5 shows the structure of the nozzle 42 and the supply tube 41. The nozzle 42 can be joined or connected to the supply tube 41 so leakage of the air or gas does not occur. The ejection hole 45 of the nozzle 42 can be, for example, a circular opening whose diameter ΦD falls within the range of 1 mm (inclusive) to 2 mm (inclusive). The flow rate distribution of the air or gas ejected from the ejection hole 45 can be axisymmetric with respect to the center axis HAX of the ejection hole 45. The flow amount of the air or gas ejected from the ejection hole 45 can be set within the range of, for example, 0.02 $m^1$/min (inclusive) to 0.2 $m^3$/min (inclusive) at 20° C. and 1 atm.

In an example, as shown in FIG. 4B, the metal base 11, the fin 15, and the nozzle 42 are arranged at positions higher than the position of an opening end 50a of the condensing mirror 50. In this case, the nozzle 42 is arranged so that a line including the center axis HAX of the ejection hole 45 is perpendicular to the center axis CAX of the metal base 11. In an example, the elevation angle of the center axis HAX of the ejection hole 45 of the nozzle 42 can fall within the range of −10° (inclusive) to +10° (inclusive), and the angle of the center axis CAX of the metal base 11 with respect to the vertical direction (Z-axis direction) can fall within the range of −10° (inclusive) to +10° (inclusive). In another viewpoint, on a plane including the center axis HAX of the ejection hole 45 and parallel to the center axis CAX of the metal base 11, the angle made by a line L1 including the center axis HAX of the ejection hole 45 and a plane perpendicular to the center axis CAX of the metal base 11 can fall within the range of −10° (inclusive) to +10° (inclusive).

Figure 6:
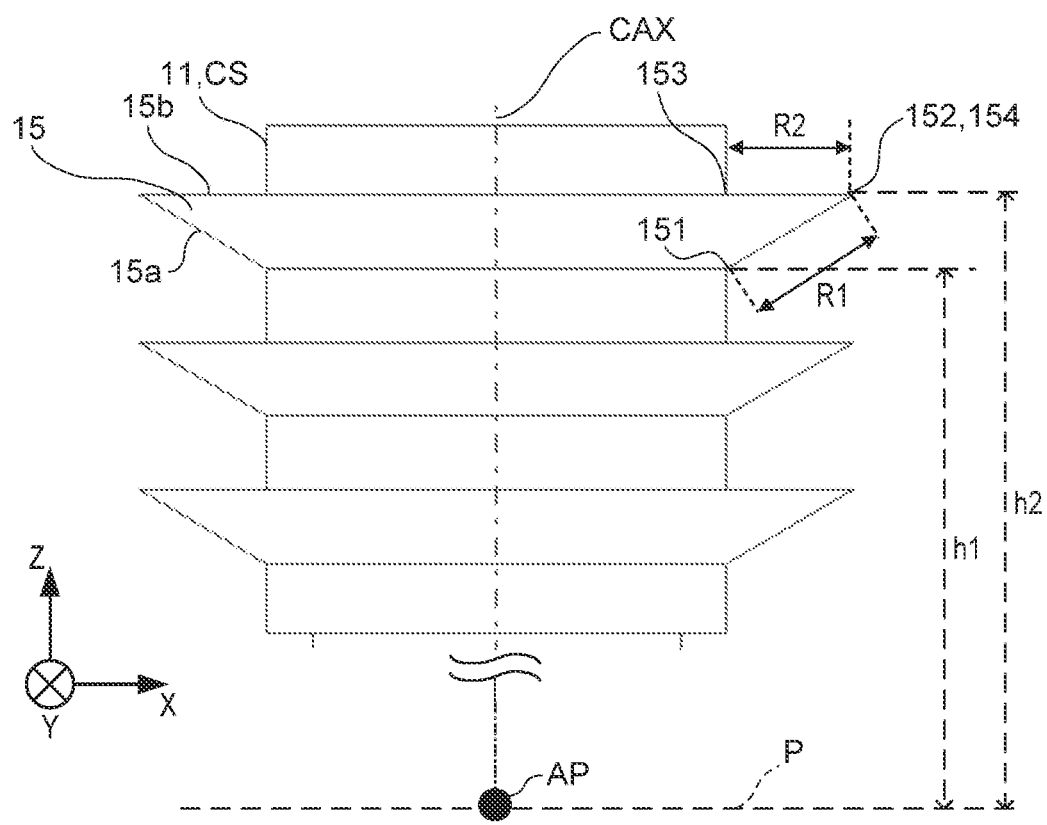
FIG. 6 is a view schematically showing the configuration of a metal base in a lamp.

FIG. 6 shows an example of the configuration of the metal base 11 and the fin 15. A first surface 15a and a second surface 15b are surfaces substantially forming the fin, and can be regarded as one surface by including a discontinuous surface. An inner edge (inner periphery) indicates a curved portion where the cylindrical surface CS of the metal base 11 intersects the first surface 15a or a curved portion where the cylindrical surface CS of the metal base 11 intersects the second surface 15b. Furthermore, an outer edge (outer periphery) indicates a curved portion far from the center axis CAX of the metal base on the first surface 15a or the second surface 15b. That is, on the first surface 15a or the second surface 15b, the inner edge indicates a curved portion close to the center axis CAX of the metal base, and the outer edge indicates a curved portion far from the center axis CAX of the metal base and existing outside the inner edge.

The fin 15 can include the first surface 15a close to the bright spot AP of the lamp and the second surface 15b far from the bright spot AP of the lamp on the opposite side of the first surface 15a. The fin 15 can have an axisymmetric shape with respect to the center axis CAX of the metal base 11. Referring to FIG. 6, a plane including the bright spot AP and orthogonal to the center axis CAX of the metal base 11 is defined as a bright spot plane P. The bright spot plane P can typically be a horizontal plane. When h1 represents the distance between the bright spot plane P and an inner edge 151 (first inner edge) of the first surface 15a and h2 represents the distance between the bright spot plane P and an outer edge 152 (first outer edge) of the first surface 15a, h1 and h2 have a relationship of h2>h1. That is, the first surface 15a has such shape that the distance from the bright spot plane P, as a plane including the bright spot AP and orthogonal to the center axis CAX of the metal base 11, to the inner edge 151 is shorter than the distance from the bright spot plane P to the outer edge 152. That is, the distance between the bright spot plane P and the inner edge 151 is shorter than that between the bright spot plane P and the outer edge 152.

The first surface 15a can include a slope inclined in a direction away from the bright spot plane P from the inner edge 151 toward the outer edge 152. In the example shown in FIG. 6, the slope can form a part of a conical surface having the center axis CAX of the metal base 11 as a cone axis. On the other hand, the second surface 15b can be formed from, for example, a flat surface orthogonal to the center axis CAX of the metal base 11. When R1 represents the distance between the inner edge 151 and the outer edge 152 of the first surface 15a and R2 represents the distance between an inner edge 153 (second inner edge) and an outer edge 154 (second outer edge) of the second surface 15b, R1 and R2 have a relationship of R1≥R2. That is, the distance between the inner edge 151 and the outer edge 152 of the first surface 15a is equal to or longer than the distance between the inner edge 153 and the outer edge 154 of the second surface 15b.

Figure 7A:
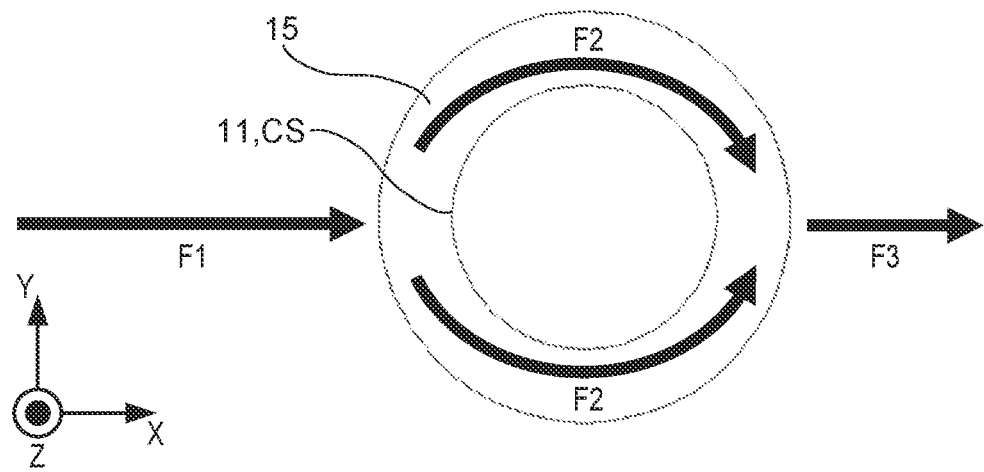
FIGS. 7A and 7B are views for explaining the flow of a gas around the metal base.
Figure 7B:
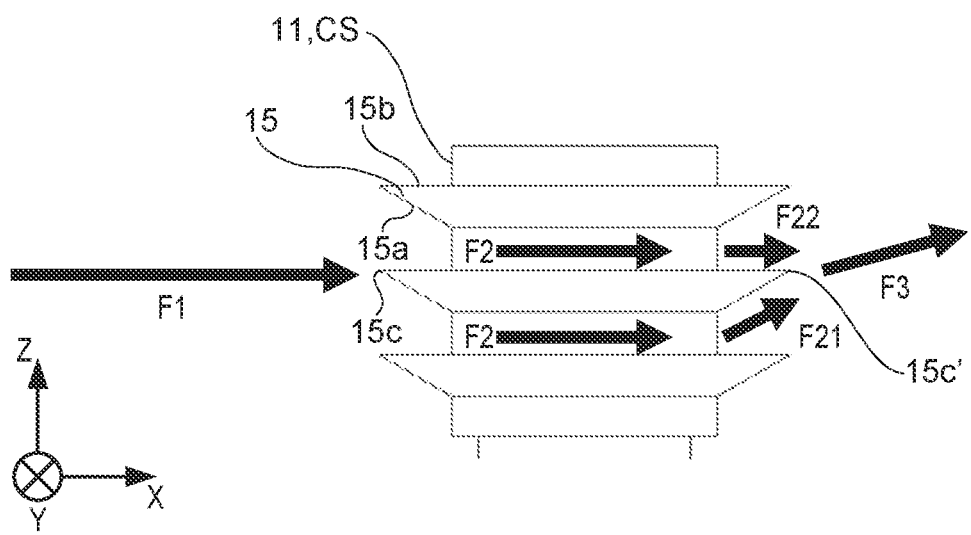

The flow of the gas around the metal base 11 according to this embodiment will be described with reference to FIGS. 7A and 7B. FIG. 7A is a plan view when viewing the metal base 11 from the Z direction, and FIG. 7B is a side view when viewing the metal base 11 from the Y direction. FIGS. 7A and 7B are views obtained by enlarging a portion around the fin 15 in FIGS. 4A and 4B, respectively.

Referring to FIG. 7A, the flow F1 of the air ejected from the nozzle 42 is separated into the two flows F2 on the side surface of the metal base 11. After the air flows along the side surface of the metal base 11, the two flows F2 merge again to form the flow F3. By focusing on the flows along the upper and lower surfaces of the fin 15 with reference to FIG. 7B, the flow F1 of the air ejected from the nozzle 42 is separated into the upper and lower flows by an outer peripheral portion 15c (corresponding to the outer edges 152 and 154 in FIG. 6) of the fin 15, thereby forming the flows F2 along the periphery of the cylindrical surface CS. On the downstream of the flows F2, the flow along the second surface 15b changes to a flow F22 without changing the height, and the flow along the first surface 15a changes its direction by the Coanda effect and changes to an upward flow F21. The flows F22 and F21 merge in an outer peripheral portion 15c' on the opposite side of the outer peripheral portion 15c to form the upward flow F3.

Note that FIGS. 6, 7A, and 7B exemplify a case in which the number of fins provided in the metal base 11 is three. The present invention, however, is not limited to this. One or a plurality of fins 15 may be provided. The plurality of nozzles 42 may be provided in correspondence with the plurality of fins 15. Furthermore, the fin 15 may be formed integrally with the metal base 11, or joined or connected by a method such as press fitting to the metal base 11. The fin 15 may be provided in the connector 11c or 11d shown in FIG. 3B, and connected to the metal base 11a or 11b.

Figure 8:
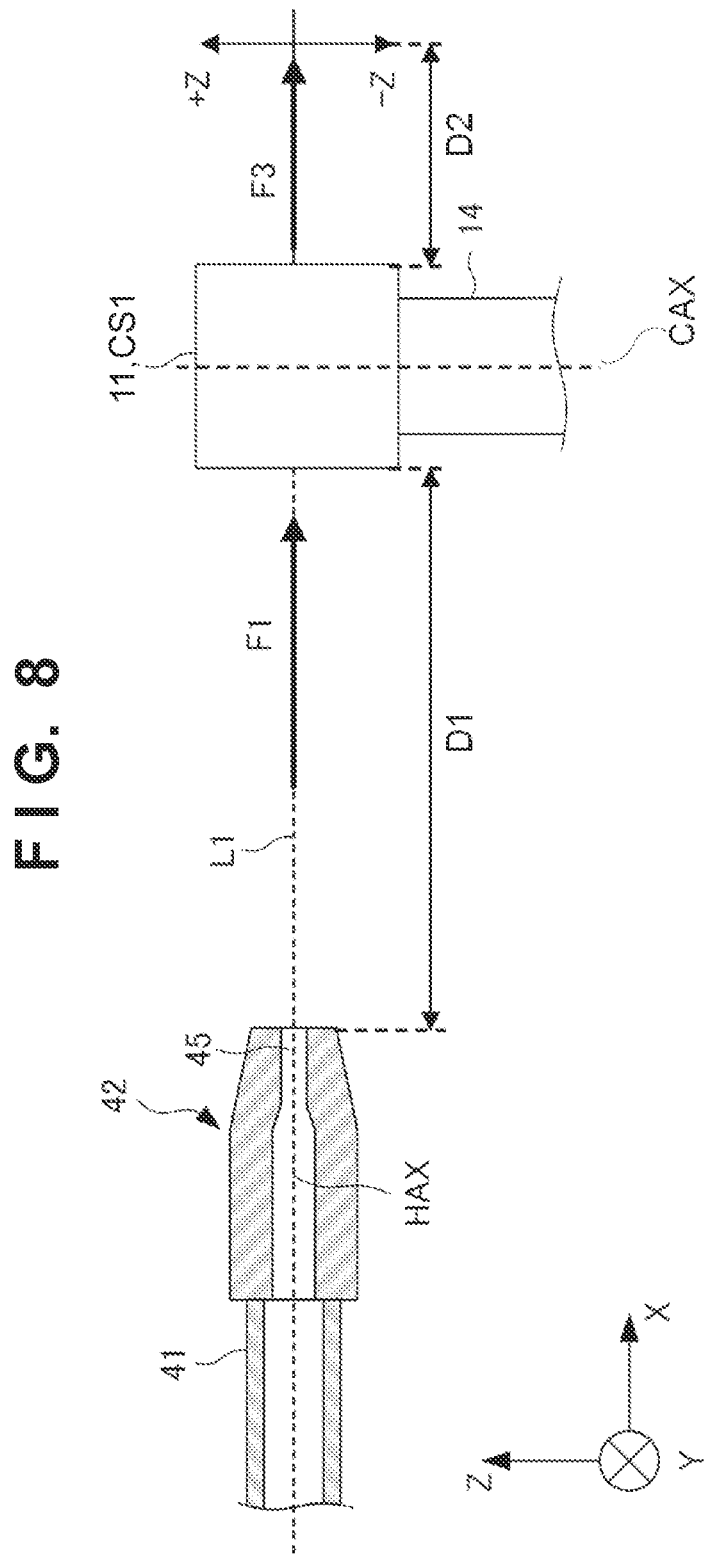
FIG. 8 is a view showing the configuration of an experimental system.

FIG. 8 shows a side view of an experimental system used to actually measure the flow of air ejected from the nozzle 42. The line L1 including the center axis HAX of the ejection hole 45 and the center axis CAX of the metal base 11 are orthogonal to each other and pass through the center of the metal base in the height direction (Z direction). Let D1 be the distance between the distal end of the nozzle 42 and a cylindrical surface CS1. Furthermore, let F1 be the flow of the air from the ejection hole 45 to the cylindrical surface CS1, and F3 be the flow of the air after passing through the cylindrical surface CS1. The position at a distance D2 from the cylindrical surface CS1 in the X direction was set as the position to measure the flow rate distribution, and the flow rate distribution in the Z direction was measured. The diameter Φ of the cylindrical surface CS was set to 40 mm, ΦD of the ejection hole 45 of the nozzle 42 was set to 1.5 mm, and the flow amount of the air ejected from the nozzle 42 was set to 0.05 m³/min (at 20° C. and 1 atm).

Figure 9A:
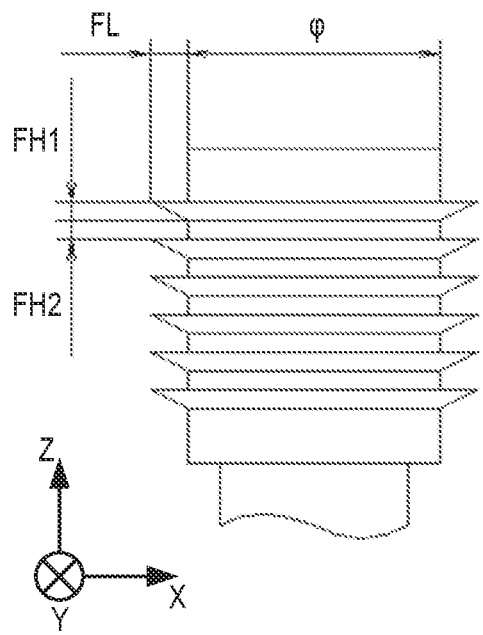
FIGS. 9A and 9B are views showing the shapes of a plurality of fins used for comparative experiments.
Figure 9B:
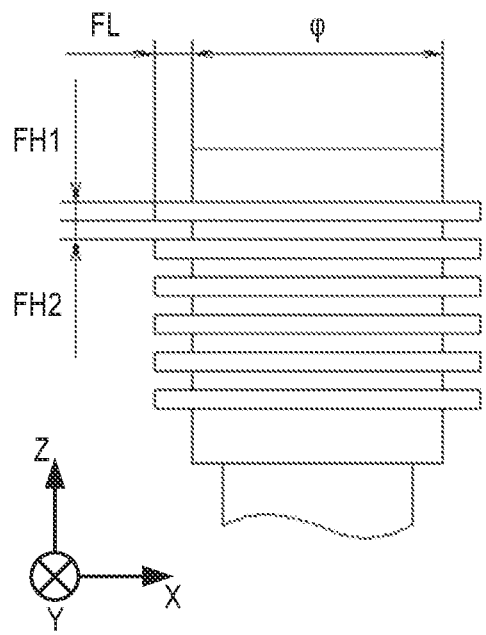

FIGS. 9A and 9B show side views of a plurality of fins used for comparative experiments. FIG. 9A shows the shape of the fin based on this embodiment. In this example, a thickness FH1 of the fin was set to 3 mm, a height FH2 of a cylindrical portion between the upper and lower fins was set to 3 mm, and a stretch length FL from the diameter Φ of the cylindrical surface CS1 was set to 6 mm. Furthermore, the lower first surface and the upper second surface of the fin were the same as in the example shown in FIG. 6. That is, the first surface of the fin is formed from, for example, a slope forming a part of the conical surface having the center axis CAX as a cone axis, and the second surface of the fin is formed from, for example, a flat surface orthogonal to the center axis CAX.

FIG. 9B shows the shape of the fin according to a comparative example. In this comparative example, a thickness FH1 of the fin was set to 3 mm, a height FH2 of a cylindrical portion between the fins was set to 3 mm, and a stretch length FL from a diameter Φ of a cylindrical surface CS1 was set to 6 mm. The lower first surface and the upper second surface of the fin were flat surfaces parallel to each other, and the surface of the fin on the outer side was a cylindrical surface. The number of fins was set to six in both FIGS. 9A and 9B.

Figure 10:
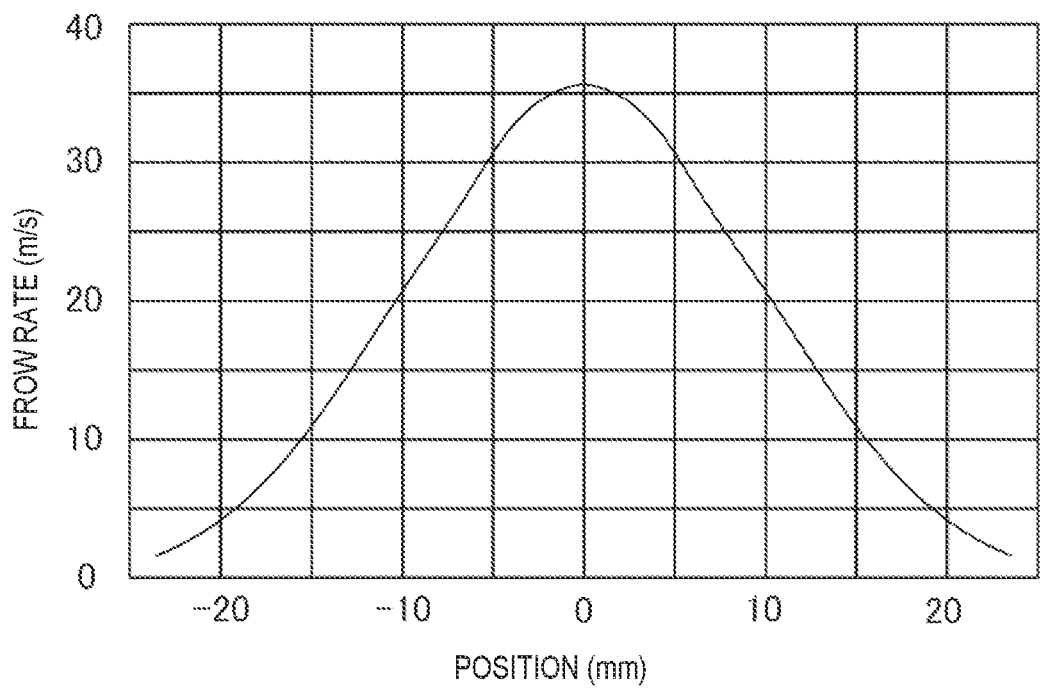
FIG. 10 is a graph showing the flow rate distribution of air in a state in which the metal base is detached.

FIG. 10 shows a result of measuring the flow rate distribution of the air ejected from the nozzle 42 at a position away from the distal end of the nozzle 42 by the distance D1=120 mm. At the time of this measurement operation, the metal base 11 shower in FIG. 8 was detached. That is, a state in which there is nothing to shield the flow of the air ejected from the nozzle 42 was set. In a graph shown in FIG. 10, the abscissa represents a position when the line L1 including the center axis HAX is set as the center, and the ordinate represents the flow rate of the air. It is understood that the flow rate distribution of the air is symmetric with respect to the line L1 including the center axis HAX. When the diameter of the condensing mirror 50 is 300 mm and the diameter Φ of the cylindrical surface CS of the metal base 11 is 40 mm, the distance D1=120 mm is the minimum distance at which the distal end of the nozzle 42 does not shield the effective luminous flux 52 shown in FIG. 2.

FIGS. 11A and 11B show the results of measuring the flow rate distribution in the ±Z directions at a position away from the cylindrical surface CS1 by the distance D2=100 mm. In graphs shown in FIGS. 11A and 11B, the abscissa represents the position in the Z direction when the line L1 including the center axis FLAX is set as the center, and the ordinate represents the flow rate of the air. FIG. 11A shows the flow rate distribution when the fin shape shown in FIG. 9A according to this embodiment is used, and FIG. 11B shows the flow rate distribution when the fin shape shown in FIG. 9B, which includes surfaces parallel to each other, is used. The spread of the flow rate distribution in the ±Z directions is narrower in FIG. 11A than in FIG. 11B, and the maximum flow rate thus rises. It can be seen that the flow rate distribution moves to the +Z side (upper side).

In an example, the distance in the height direction (the length of the stein 14) between the metal base 11 and the light-emitting tube 13 in the lamp 10 is about 80 mm, and the distance in the height direction (Z direction) between the metal base 11a on the upper side and the upper end (opening end) of the condensing mirror 50 can be set to about 50 mm. Hence, by adopting the configuration of this embodiment, it is possible to suppress diffusion of the air blown to the metal base 11 to the range other than the metal base 11. This makes it possible to suppress direct cooling of the light-emitting tube 13 of the lamp 10 by the air blown to the metal base 11 or indirect cooling of the light-emitting tube 13 by the air flowing into the internal space of the condensing mirror 50, and prevent a lighting failure or non-lighting from occurring due to excessive cooling of the lamp 10. Therefore, according to the first embodiment, it is possible to cause the lamp 10 to stably emit light.

Furthermore, according to this embodiment, the thickness of the fin is small in the outer peripheral portion 15c and becomes larger toward the cylindrical surface CS of the metal base 11. That is, the channel through which the air ejected from the nozzle 42 flows gradually becomes narrow. Therefore, the flow rate of the air ejected from the nozzle 42 rises from the outer peripheral portion 15c of a fin toward the cylindrical surface CS. This can improve the cooling efficiency of the metal base 11.

In addition, along with the improvement of the output of the lamp 10, when the lead wire 32a that supplies power to the metal base 11a is irradiated with the luminous flux reflected by the condensing mirror 50, the temperature of the lead wire 32a may rise to cause oxidation and deterioration of the lead wire 32a. If a dedicated air blowing mechanism is provided to cool the lead wire 32a, the running cost of the exposure apparatus 100 may be increased by an increase in the cost of the light source device 110 or an increase in the air flow amount. By arranging the lead wire 32a so that the flow F3 of the air or gas is formed in a portion (temperature increasing portion) of the lead wire 32a irradiated with the luminous flux, the portion of the lead wire 32a can be cooled at a low cost.

Second Embodiment

The second embodiment will be described below. Matters that are not mentioned as the second embodiment can comply with the first embodiment. Modifications of the shape of a fin 15 provided in a metal base 11 in a light source device 110 will be described with reference to FIGS. 12A to 12I. Each of FIGS. 12A to 12I is a sectional view of the metal base 11 passing through a center axis CAX of the metal base 11. The shape of the fin 15 shown in each of FIGS. 12A to 12I is axisymmetric with respect to the center axis CAX.

Figure 12A:
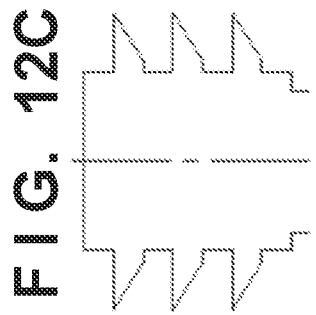
FIGS. 12A to 12I are views showing modifications of a fin shape.
Figure 12B:
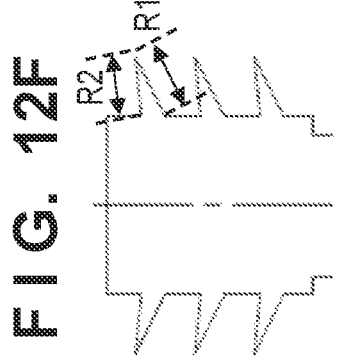

FIG. 12A shows the shape of the fin described in the first embodiment. The fin 15 shown in FIG. 12A includes a first surface 15a close to a bright spot AP of a lamp and a second surface 15b far from the bright spot AP of the lamp on the opposite side of the first surface 15a. The first surface 15a can include a slope inclined in a direction away from a bright spot plane P (see FIG. 6) from an inner edge toward an outer edge. This slope may form, for example, a part of a conical surface having the center axis CAX of the metal base 11 as a cone axis. Referring to FIG. 12A, the second surface 15b forms a flat surface parallel to a plane orthogonal to the center axis CAX of the metal base 11.

Each of FIGS. 12B to 12I shows a modification with respect to FIG. 12A. Note that FIGS. 12B to 12I do not illustrate reference numerals and symbols for the sake of visual convenience. The differences from FIG. 12A and features will be described below.

Figure 12C:
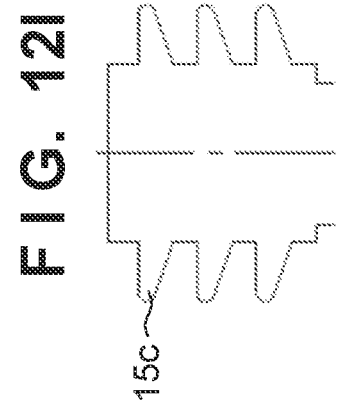
Figure 12D:
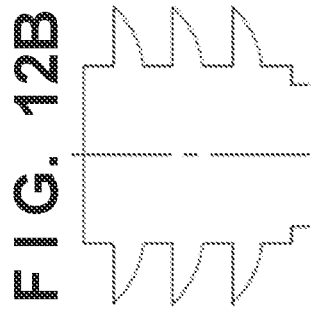

Referring to FIG. 12D, a first surface 15a includes a spherical surface, a toroidal surface, or a free curved surface that connects the inner edge and the outer edge.

Referring to FIG. 12C, a first surface 15a is formed by a combination of a conical surface (slope) and a flat surface orthogonal to the center axis CAX of the metal base 11.

Referring to FIG. 12D, a first surface 15a is formed by a staircase shape obtained by a combination of flat surfaces and cylindrical surfaces or conical surfaces. This staircase shape may be understood as a shape that substantially forms the slope shown in FIG. 12A as a whole. This staircase shape is advantageous in that it can be easy to manufacture the fin to implement the slope of the first surface 15a shown in each of FIGS. 12A to 12C.

Figure 12E:
Figure 12F:
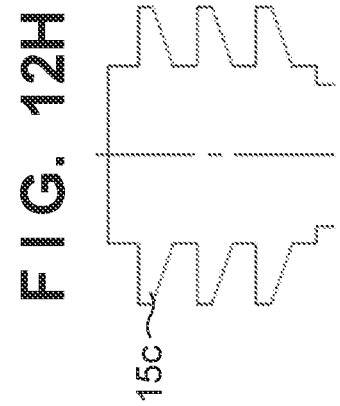
Figure 12G:
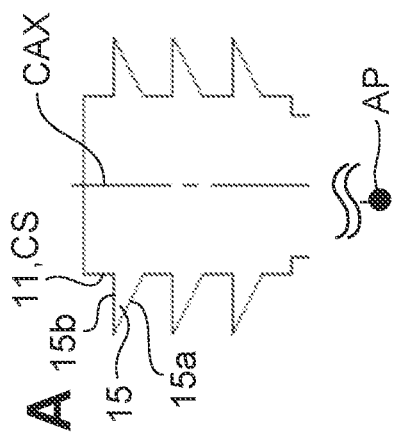

As compared with FIGS. 12A to 12D, the configuration of a second surface 15b is different in each of FIGS. 12E to 12G. In each of FIGS. 12A to 12D, the second surface 15b is formed by a flat surface orthogonal to the center axis CAX of the metal base 11. To the contrary, referring to FIG. 12E, the second surface 15b can include a slope inclined in a direction to approach the bright spot plane P from the inner edge toward the outer edge. This slope may form, for example, a part of a conical surface having the center axis CAX of the metal base 11 as a cone axis. Referring to FIG. 12F, the second surface 15b can include a slope inclined in a direction away from the bright spot plane P from the inner edge to the outer edge. This slope may form a part of the conical surface of a cone having the center axis CAX of the metal base 11 as a cone axis. The degree of inclination of the conical surface is smaller than that of a first surface 15a. To the contrary, in FIG. 12G, the degree of inclination of the second surface 15b is equal to that of a first surface 15a. That is, the second surface 15b shown in FIG. 12G includes a slope inclined at the same degree of inclination as that of the first surface 15a in a direction away from the bright spot plane P from the inner edge toward the outer edge. In other words, the fin 15 shown in FIG. 12G is a plate-like fin having a uniform thickness.

Figure 12H:
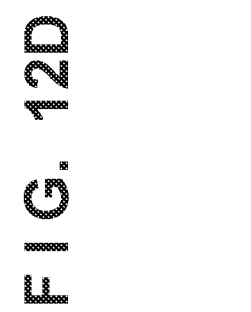

Referring to FIG. 12H, the side surface of an outer peripheral portion 15c of the fin 15 is firmed by a cylindrical surface or a conical surface.

Figure 12I:
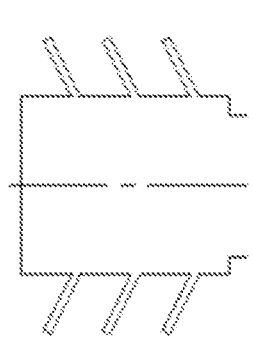

Referring to FIG. 12I, the side surface of an outer peripheral portion 15c of the fin 15 is formed by a toroidal surface or a free curved surface.

As described above, there can be the various shapes of the fins 15. These shapes all have a relationship of R1≥R2, as shown in FIGS. 12E and 12F, where R1 represents the distance between the inner edge and the outer edge of the first surface 15a and R2 represents the distance between the inner edge and the outer edge of the second surface 15b. Note that the shape of the fin 15 may be obtained by arbitrarily combining the first surfaces 15a and the second surfaces 15b shown in FIGS. 12A to 12I. Furthermore, at least one of the first surface 15a and the second surface 15b can have an axisymmetric shape with respect to the center axis CAX of the metal base 11.

According to the second embodiment, it is possible to obtain the same effect as in the first embodiment, and optimize the flow of a gas around the metal base 11. It becomes easy to manufacture the fin, thereby making it possible to make an attempt to reduce the cost. Furthermore, it is possible to reduce the risk that a person or an object gets injured or damaged from touching the distal end portion of the fin.

Third Embodiment

Figure 13:
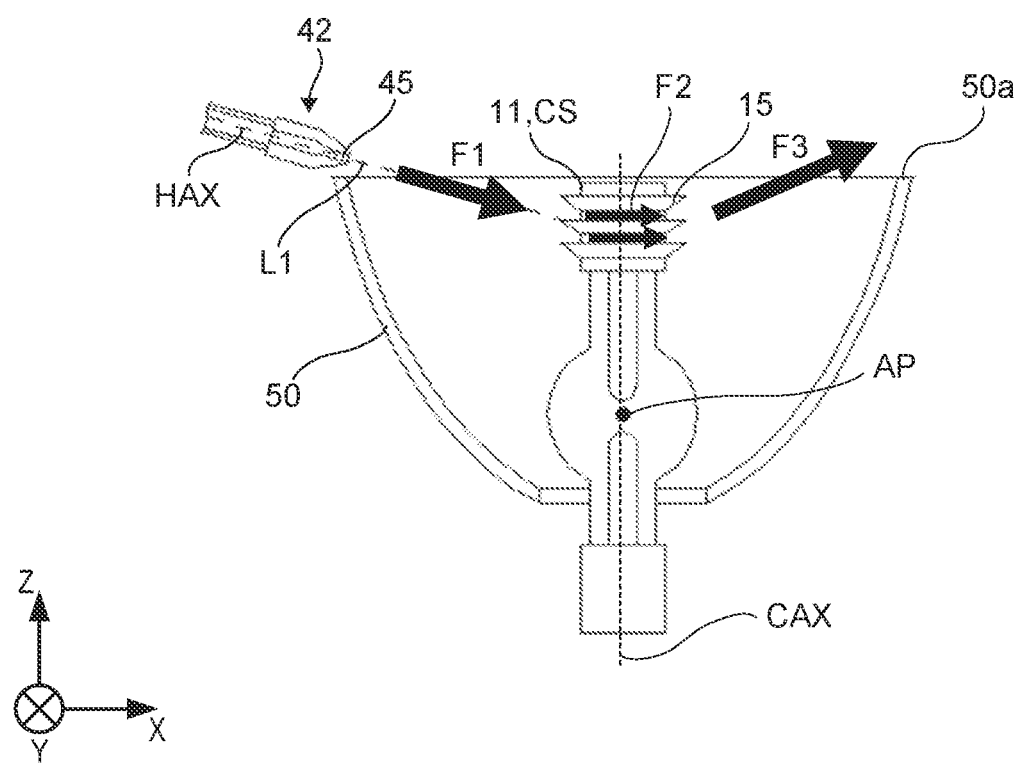
FIG. 13 is a view schematically showing the configuration of a light source device.

The configuration of a light source device 110 in an exposure apparatus according to the third embodiment will be described below with reference to FIG. 13. Matters that are not mentioned as the third embodiment can comply with the first embodiment. FIG. 13 is a side view showing an arrangement example of a metal base 11, a nozzle 42, and a condensing mirror 50 in the light source device 110 according to the third embodiment.

In FIG. 4B according to the first embodiment, the metal base 11, the fin 15, and the nozzle 42 are arranged at positions higher than the position of the opening end 50a of the condensing mirror 50. However, to improve the trapping efficiency of light from the lamp 10 by the condensing mirror 50, the size of the condensing mirror 50 may be increased, and the position of the opening end 50a of the condensing mirror 50 may become higher than that of the metal base 11 of the lamp 10 in the vertical direction (Z-axis direction). That is, at least parts of the metal base 11 and the fin 15 can be arranged at positions lower than the position of the opening end 50a of the condensing mirror 50. However, the nozzle 42 is arranged at a position higher than the position of the opening end 50a of the condensing mirror 50. FIG. 13 shows such an example.

Referring to FIG. 13, the metal base 11 can include a cylindrical surface CS and at least one fin 15 radially extending outside the cylindrical surface CS. The nozzle 42 includes an ejection hole 45 that ejects a gas to cool the metal base 11. The ejection hole 45 has a center axis HAX. For example, if the ejection hole 45 has a cylindrical shape, the center axis HAX of the ejection hole 45 matches the center axis of the cylindrical shape. The nozzle 42 is arranged at a position where the center axis HAX intersects the center of the metal base 11 or at least part of the fin 15 or the metal base 11. The flow of the gas ejected from the ejection hole 45 is schematically shown as F1, F2, and F3.

In this embodiment, as described above, while the metal base 11 is arranged on the lower side (−Z side) of an opening end 50a of the condensing mirror 50, the nozzle 42 is arranged on the upper side (+Z side) of the opening end 50a of the condensing mirror 50. In this configuration, the nozzle 42 is arranged so that a line including the center axis HAX of the ejection hole 45 intersects the side surface of the metal base 11. In an example, the elevation angle of the center axis HAX of the ejection hole 45 of the nozzle 42 can fall within the range of −30° (inclusive) to 0° (inclusive), and the angle of a center axis CAX of the metal base 11 with respect to the vertical direction (Z-axis direction) can fall within the range of −10° (inclusive) to +10° (inclusive). In another viewpoint, on a plane including the center axis HAX of the ejection hole 45 and parallel to the center axis CAX of the metal base 11, the angle made by a line L1 including the center axis HAX of the ejection hole 45 and a plane perpendicular to the center axis CAX of the metal base 11 can fall within the range of −30° (inclusive) to 0° (inclusive).

In this embodiment, the configuration of the metal base 11 and the fin 15 is the same as in the first or second embodiment. Similar to the first embodiment, in the flow of air after passing through the cylindrical surface CS of the metal base 11, the flow F3 in a direction away from a bright spot AP of a lamp can be obtained. Therefore, as shown in FIG. 13, even if the metal base 11 is arranged on the lower side (−Z side) of the opening end 50a of the condensing mirror 50, it is possible to prevent the air blown to the metal base 11 from excessively flowing into the internal space of the condensing mirror 50. Therefore, in this embodiment as well, similar to the first embodiment, it is possible to suppress diffusion of the air blown to the metal base 11 to the range other than the metal base 11, and thus prevent a lighting failure or non-lighting from occurring due to excessive cooling of the lamp 10.

Embodiment of Article Manufacturing Method

An article manufacturing method according to the embodiment will be described below. The article manufacturing method is suitable for manufacturing, for example, an article such as a device (a semiconductor element, a magnetic storage medium, a liquid crystal display element, or the like) or a color filter. The article manufacturing method can include an exposure step of exposing a substrate (which is coated with a photosensitive agent) using the above-described exposure apparatus, a development step of developing the substrate exposed in the exposure step, and a processing step of processing the substrate that has undergone the development step to obtain an article. The processing step can include, for example, known processes (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

While the present invention leas been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-067246, filed Apr. 12, 2021, which is hereby incorporated by reference herein in its entirety.

What is claimed is:

1. A light source device comprising:
   a lamp including a light-emitting tube having a bright spot, and a metal base connected to an end portion of the light-emitting tube; and
   a nozzle including an ejection hole configured to eject a gas to cool the metal base,
   wherein the lamp comprises a fin provided in a periphery of the metal base, wherein the fin includes a first surface and a second surface on an opposite side of the first surface, wherein the first surface is closer to the bright spot than the second surface is,
   wherein the first surface and the second surface is configured such that a flow of the gas ejected from the nozzle is separated into a first flow along the first surface and a second flow along the second surface, the first flow and the second flow advance along a side surface of the metal base, and then the first flow is attracted into the second flow, thereby the first flow is merged with the second flow,
   wherein a distance between a first inner edge of the first surface and a bright spot plane as a plane orthogonal to a center axis of the metal base including the bright spot is shorter than a distance between the bright spot plane and a first outer edge of the first surface, and
   wherein a distance between the first inner edge and the first outer edge of the first surface is not shorter than a distance between a second inner edge and a second outer edge of the second surface.

2. The device according to claim 1, wherein the first surface includes a slope inclined in a direction away from the bright spot plane from the first inner edge toward the first outer edge.

3. The device according to claim 2, wherein the slope forms a part of a conical surface having the center axis as a cone axis.

4. The device according to claim 2, wherein the first surface includes the slope and a flat surface orthogonal to the center axis.

5. The device according to claim 2, wherein the second surface includes a slope inclined at the same degree of inclination as a degree of inclination of the first surface in a direction away from the bright spot plane from the second inner edge toward the second outer edge.

6. The device according to claim 1, wherein the first surface includes one of a spherical surface and a toroidal surface, which connects the first inner edge and the first outer edge.

7. The device according to claim 1, wherein the second surface includes a flat surface orthogonal to the center axis.

8. The device according to claim 1, wherein the second surface includes a slope inclined in a direction to approach the bright spot plane from the second inner edge toward the second outer edge.

9. The device according to claim 1, wherein the second surface includes a slope inclined in a direction away from the bright spot plane from the second inner edge toward the second outer edge.

10. The device according to claim 1, wherein at least one of the first surface and the second surface has an axisymmetric shape with respect to the center axis of the metal base.

11. The device according to claim 1, further comprising:
    a holder configured to hold the lamp; and
    a condensing mirror configured to condense light generated by the lamp.

12. The device according to claim 11, wherein
    in orthogonal projection to a plane parallel to the center axis of the metal base, the metal base, the fin, and the nozzle are arranged at positions higher than a position of an opening end of the condensing mirror, and
    the nozzle is arranged so that a line including a center axis of the ejection hole is perpendicular to the center axis of the metal base.

13. The device according to claim 11, wherein
    in orthogonal projection to a plane parallel to the center axis of the metal base, at least parts of the metal base and the fin are arranged at positions lower than a position of an opening end of the condensing mirror, and the nozzle is arranged at a position higher than the position of the opening end of the condensing mirror, and
    the nozzle is arranged so that a line including a center axis of the ejection hole intersects a side surface of the metal base.

14. The device according to claim 11, wherein the nozzle is arranged outside an effective luminous flux emitted from the lamp and reflected by the condensing mirror.

15. The device according to claim 11, wherein a flow rate distribution of the gas ejected from the ejection hole is axisymmetric with respect to a center axis of the ejection hole.

16. The device according to claim 11, wherein the condensing mirror is an ellipsoid mirror.

17. An exposure apparatus comprising:
    a light source device defined in claim 11;
    an illumination optical system configured to illuminate an original with light from the light source device; and
    a projection optical system configured to project a pattern of the original to a substrate.

18. An article manufacturing method comprising:
    exposing a substrate using an exposure apparatus defined in claim 17;
    developing the exposed substrate; and
    obtaining an article by processing the developed substrate.

* * * * *